United States Patent [19]

Nimishakavi

[11] Patent Number: 5,363,383
[45] Date of Patent: Nov. 8, 1994

[54] CIRCUIT FOR GENERATING A MODE CONTROL SIGNAL

[75] Inventor: Hanumanthrao Nimishakavi, San Jose, Calif.

[73] Assignee: Zilog, Inc., Campbell, Calif.

[21] Appl. No.: 98,750

[22] Filed: Jul. 29, 1993

Related U.S. Application Data

[63] Continuation of Ser. No. 640,058, Jan. 11, 1991.

[51] Int. Cl.⁵ .................... H04B 17/00; G01R 15/12
[52] U.S. Cl. ................... 371/22.1; 371/22.6; 371/22.3; 324/73.1; 324/158.1
[58] Field of Search ............ 371/22.1, 22.6, 22.3, 371/24, 67.1, 71; 324/158 R, 73.1, 76.68

[56] References Cited

U.S. PATENT DOCUMENTS

| | | | |
|---|---|---|---|
| 4,002,974 | 1/1977 | Thomas | 324/73 |
| 4,703,483 | 10/1987 | Enomoto et al. | 371/22.1 |
| 4,742,486 | 5/1988 | Takemae et al. | 371/22.1 |
| 4,857,774 | 8/1989 | El-Ayat et al. | 307/465 |
| 5,005,173 | 4/1991 | Martin | 371/22.5 |
| 5,012,185 | 4/1991 | Ohfuji | 324/158 R |
| 5,036,272 | 7/1991 | Cho et al. | 371/22.1 |
| 5,103,167 | 4/1992 | Okano et al. | 371/22.1 |

*Primary Examiner*—Robert W. Beausoliel, Jr.
*Assistant Examiner*—Trinh Tu
*Attorney, Agent, or Firm*—Majestic, Parsons, Siebert & Hsue

[57] ABSTRACT

A mode control circuit is disclosed which generates a mode control signal in response to an illegal state detected as a combination of inputs and outputs. An illegal state is forced by the application of a fixed voltage to an output pin. The mode control signal is used to switch input-output signals of a megacell internal to an application specific integrated circuit to the output pins of the package so that testing of the megacell is facilitated.

18 Claims, 3 Drawing Sheets

CIRCUIT FOR GENERATING A MODE CONTROL SIGNAL

This is a continuation of application Ser. No. 640,058, filed Jan. 11, 1991.

BACKGROUND OF THE INVENTION

This invention relates generally to a circuit for generating a mode control signal, and more specifically to an integrated circuit package containing several megacells where the mode control signal is used to connect I/O signals and other signals of a megacell to the pins of the integrated circuit package.

Very large scale integration (VLSI) has high component (e.g., transistors, logic gates, etc.) densities in a single integrated circuit package. Typically, each package houses a complex device such as a central processing unit (CPU), interface adapter, memory, etc., which are modules used to build, for example, a dedicated computer system. Each package contains a die which is a semiconductor substrate upon which has been fabricated the transistors and other components of the device. Common methods of fabricating the die include chemical vapor deposition, ion implantation, and molecular beam epitaxy. Each of these methods uses some form of design definition of the interconnections and placement of components which make up the device.

These design definitions can exist physically, as in the case of a mask used in a photolithographic process, or the design definition may merely exist in a computerized database. All such design definitions will be referred to in this specification as megacells.

Over the years, manufacturers have cataloged a large library of megacells used to build devices which have been marketed. Recently, new technology has emerged which makes it possible to combine the dies generated by each mask onto a single large substrate, thereby providing that several previously discretely packaged dies can be combined into one integrated circuit package. In such a device comprising 2 or more dies on a single substrate, each die is then referred to as a megacell.

One form of this technology produces what are called application specific integrated circuits (ASICs), where a manufacturer will produce for a customer a single integrated circuit package designed to meet the customer's specific application. For example, a CPU, an interrupt controller and a peripheral interface adapter can be combined into one ASIC, thus achieving in one integrated circuit package what previously required three packages mounted on a circuit board including interconnecting metallized conductors and various support circuitry.

In an ASIC, the megacells are connected to each other as needed by conductors fabricated onto the single substrate. Additionally, "glue" logic is provided on the substrate to perform functions which were previously formed by small-scale or medium-scale discretely packaged integrated circuits. Thus, this technology provides a great savings in size, and other benefits such as lower power consumption.

However, a problem with ASIC technology is that it is difficult to independently test or exercise each of the megacells once the package has been assembled. It is desirable to be able to test each megacell independently since logically each megacell performs a well-defined function. Usually, testing software already exists for these megacells as each megacell has been previously manufactured and marketed as a discrete device. However, this testing software assumes that all of the input and output (I/O) signals to and from the megacell are available at package pins, this being the case when the megacell was discretely packaged. In an ASIC, though, many of a given megacell's I/O signals will not be available at the integrated circuit package pins because the megacell's I/O signals have been directly interconnected with other megacells on the substrate so in normal operation it is no longer necessary to provide those signals externally to the ASIC package.

Therefore, it is desirable to provide a means whereby an individual megacell's I/O signals will be made available at the pins of the ASIC so they may be accessed externally for testing purposes. This may mean that all of a megacell's I/O signals, or merely a subset of a megacell's I/O signals, need to be present at the ASIC's pins.

As many signals as are needed for complete testing of the megacell must be provided at pins. However, such pins are usually in short supply in a given integrated circuit package. In today's designs, many of the pins on a given integrated circuit package are already performing more than one function, and there are no spare pins. Also, this individual megacell testing will typically only be done at the time of manufacture, and it is undesirable to provide I/O signals at package pins which are not needed by the end user.

As used in this specification, "I/O signals," or merely, "signals," means any electrical connection to a device or megacell including power connections.

It is a primary object of the present invention to provide a means of switching megacell I/O signals to output pins on an integrated circuit package in order to individually test a megacell, wherein this means has no impact on the end use of the package.

SUMMARY OF THE INVENTION

The present invention uses a mode control circuit connected between an output of the integrated circuit and one of the output pins on the chip package. Upon power-up, the output of the integrated circuit is passed to the output pin of the package by the mode control circuit. This output is a fixed voltage, for example, a logic low. An external voltage of a different logic level, in this case logic high, is applied to the output pin. The mode control circuit detects this as an illegal state and generates a mode control signal. The mode control signal is used to switch the I/O signals of a predetermined megacell, as by means of a multiplexer, to the pins of the chip package. The mode control circuit also acts to disable the output logic low so that the output driving circuitry will not be unduly stressed due to the "forced" logic high being applied to the output pin.

Thus, the I/O signals of the predetermined megacell are available at output pins so that testing of the megacell can be carried out. This test mode will be enabled as long as the output pin is held forced to an illegal state by continued application of the logic high voltage.

Additional objects, advantages and features of the various aspects of the present invention will become apparent from the following description of a preferred embodiment thereof, which description should be taken in conjunction with the accompanying drawings.

DESCRIPTION OF THE PREFERRED EMBODIMENT

Figure 1:
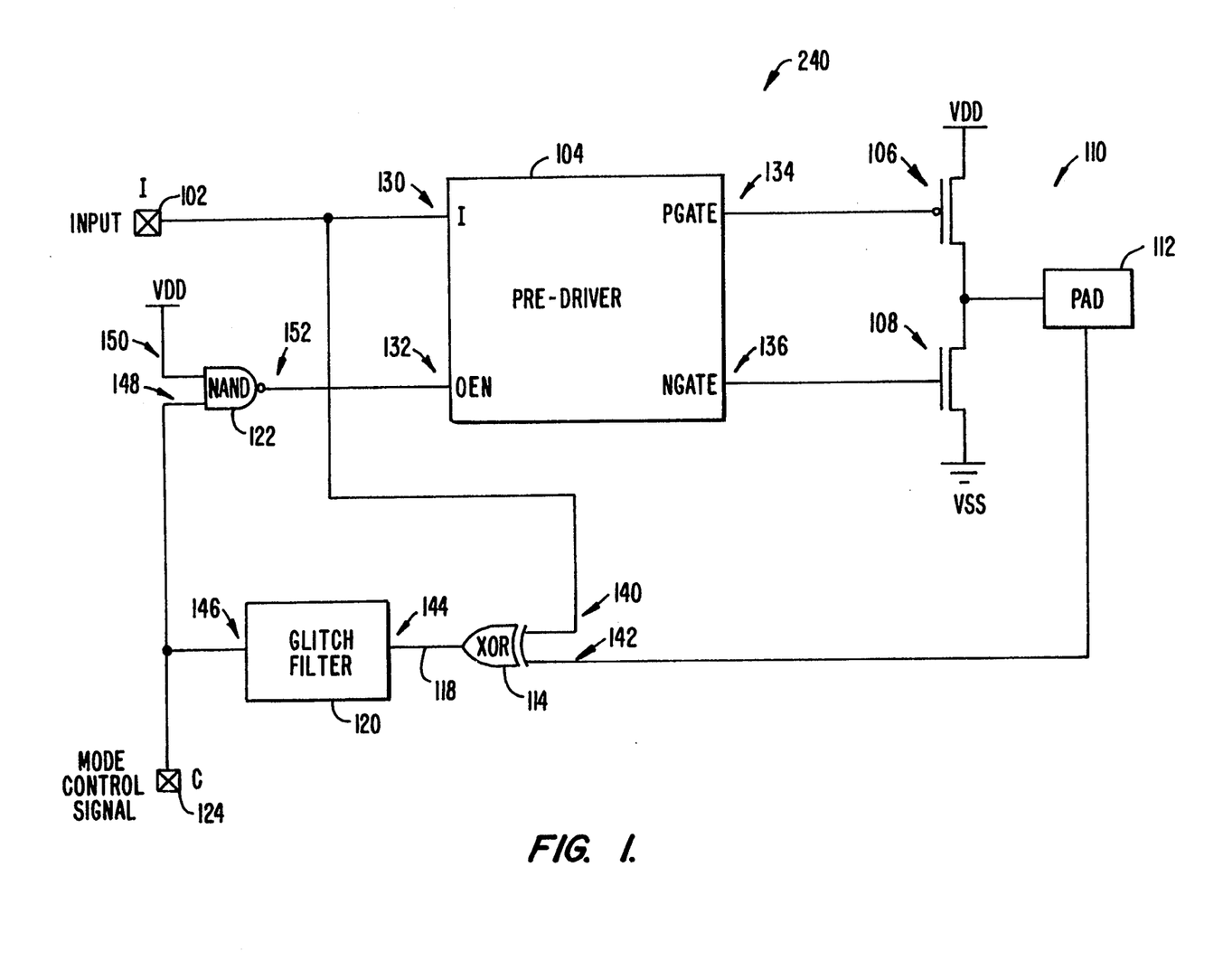
FIG. 1 is a schematic diagram illustrating the mode control circuit.

FIG. 1 is a schematic diagram of the mode control circuit 240 of the present invention. Connection 102 is an input to the mode control circuit and is designated as signal I. Signal I at connection 102 is an output signal from a megacell or from other supporting circuitry on the substrate of the ASIC (not shown). Signal I is attached to the input 130 of predriver 104.

Predriver 104 is of a type well-known in the art, and generates signals PGATE 134 and NGATE 136 in response to signal I. In addition, predriver 104 has an output enabling signal OEN at 132. The signal PGATE 134 of predriver 104 is connected to P-channel transistor 106 of the output driving circuit. Similarly, the signal NGATE 136 of predriver 104 is connected to an N-channel transistor 108 of the output driving circuit 110.

Output driving circuit 110 is well-known in the art and its operation in conjunction with predriver 104 is conventional. As can be seen, the P-channel transistor of output driving circuit 110 has its source connected to $V_{DD}$ or logic high. The drain of P-channel transistor 106 is connected to the drain of N-channel 108, while the source of N-channel transistor 108 is connected to voltage potential $V_{SS}$ or logic low. Signals PGATE and NGATE are normally complementary signals with the input signal, I, of predriver 104. Thus, when signal I is high, normally the signal at PGATE 34 will be low, and the signal at NGATE 136 will be low. Conversely, when the signal I is low, normally the signal at PGATE 134 will be high and the signal at NGATE 136 will be high.

Thus, it is seen that when the signal I is high, normally transistor 106 will be turned on and transistor 108 will be turned off, thus causing a voltage potential $V_{DD}$ or logic high to be applied at pad 112. Conversely, when the signal I is low, transistor 108 will be on, pulling the voltage potential at pad 112 to $V_{SS}$ or logic low, and transistor 106 will be off. Thus, in normal operation (non-test mode) of the mode control circuit of FIG. 1, the signal I is duplicated at the output pad 112.

Exclusive-OR gate 114 has two inputs 140 and 142. Input 140 is connected to signal I, the other input 142 is connected to pad 112. The functioning of exclusive-OR gate 114 is well-known to produce a logic low at its output 118 except when one and only one of its two inputs is logic high. As explained above, since the signal I is duplicated at pad 112 in normal operation, normally conditions where one and only one of the two inputs to exclusive-OR gate 114 is high will not occur. In other words, the two inputs will normally either both be low or both be high, except in the cases discussed below, dealing with propagation delay.

Output 118 of exclusive-OR gate 114 is connected to the input end 144 of glitch filter 120. Glitch filter 120 serves to pass all signals, except for logic high signals which are not present continuously for a sufficient length of time. Therefore, in normal operation, when the input 144 to glitch filter 120 is low, the output 146 of the glitch filter will also be low.

Glitch filter 120's output 146 is connected to input 148 of NAND-gate 122. The other input 150 of NAND-gate 122 is tied to $V_{DD}$ or logic high. Therefore, NAND-gate 122 functions as an inverter to glitch filter 120's output 146. The output 152 of NAND-gate 122 is connected to the output enable signal 132 of predriver 104.

When the output enable signal 132 is high, the predriver functions as previously discussed; that is, signal I is duplicated at the output of pad 112. When the output enable signal 132 is low, however, the signal at PGATE 134 will be high, and the signal at NGATE 136 will be low. Thus, both transistors 106 and 108 of output driver circuit 110 will be disabled, thereby neither pulling pad 112 high nor low. In effect, the output driving circuitry 110 has been placed in a high impedance state, and pad 112 can now be used as an input without damaging the output driving circuitry 110.

Output enabling signal 132 will only be low, thereby placing output driving circuitry 110 in a high impedance state, when the signal at pad 112 is not the same as the signal I. This does not occur in the normal operation of mode control circuit 240, but will occur when pad 112 is forced into an illegal state by the application of an external voltage of a different logic level than the signal I.

Upon powering up of the integrated circuit package, the signal I will be in a known state. This is achieved by proper design of the megacell circuitry, which is well-known in the art.

If the signal I has been designed to power-up as a logic 0, then in order to activate the mode control signal C at connection 124, i.e. make signal C go high, a logic 1 must be forced at pad 112 by applying a logic high, or $V_{DD}$, at pad 112. Conversely, if the signal I powers up in a high logic state, then a voltage potential $V_{SS}$ must be applied to pad 112.

Each of these two cases results in one and only one of the two input signals to exclusive-OR gate 114 being at logic high. Therefore, the output 118 will be logic high. Assuming for now that this logic high is continuous long enough so that glitch filter 120 passes it, this logic high will be seen at the input 148 to NAND-gate 122 which is connected to the output 146 of glitch filter 120. Therefore, both inputs to NAND-gate 122 are at logic high. The output of NAND-gate 122 tied to the output enabling signal 132 of predriver 104 will be low, thus disabling the output driving circuit 110 and placing the output driving circuit 110 into a high impedance mode. The disabling of the output driving circuitry 110 occurs quickly enough so that the output driving circuitry is not damaged by the forced application of a voltage at pad 112.

The output 146 of glitch filter 120 is also applied to connection 124, which is labeled signal C. Signal C is a mode control signal to be used in a circuit for switching the I/O signals of a selected megacell to pins of the chip package thereby placing the package into a test mode.

Figure 2:
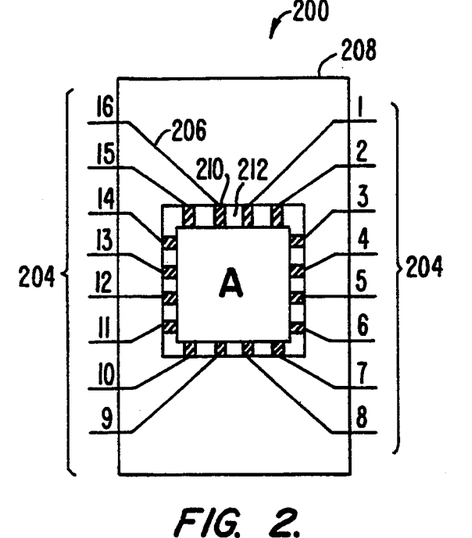
FIG. 2 is a diagram showing a die in a discrete package.

FIG. 2 shows an integrated circuit package 200 comprised of a housing 208 in which a die A on substrate 212 is contained. Die A is attached to pins such as 204 of the integrated circuit package by leads such as 206. In package 200, leads 206 are small wires attached to connection pads such as 210 on the substrate 212.

Figure 3:
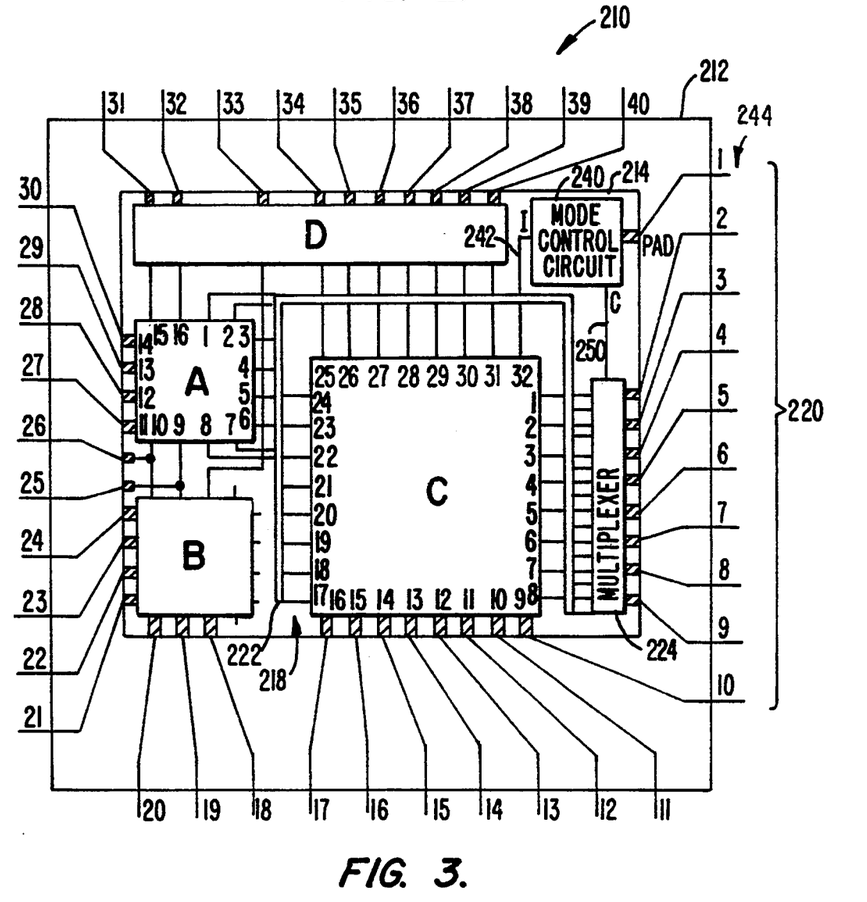
FIG. 3 shows several dies, including the die of FIG. 2, fabricated as megacells in an ASIC.

In FIG. 3, device 210 is an ASIC which includes a housing 212 and a single semiconductor substrate 214. The substrate 214 includes conceptual representations of three megacells A, B and C and "glue logic," D. Megacell A in FIG. 3 is the die labeled "A" in FIG. 2. Connections such as 218 connected to megacell C of device 210 are actually formed on substrate 214 by a process such as vapor deposition. In FIG. 3, pins such as 220 are provided around the periphery of housing 212. Megacell A can be seen connected directly to pins 25-30, although not all of the I/O signals of megacell A are connected to pins.

For example, some of megacell A's I/O signals are routed through lines 222 to megacell C. These signals on lines 222 have also been connected to multiplexer 224 which is capable of selecting between megacell A's signals and megacell C's signals for connection to pins 2-9.

In normal operation of ASIC 210, megacell C's signals 1-8 are routed to multiplexer 224 and made available at the pins 2-9 of ASIC 210. Additionally, megacell C has an output 242 from output 32 connected to signal I of mode control circuit 240. This is an output signal from megacell C which is made available at pin 1 of ASIC 210 in normal operation.

As previously explained, mode control circuit 240 in normal operation of ASIC 210 will reflect signal I at output pin 1 of ASIC 210, thereby being transparent to the operation of ASIC 210. Also, mode control signal C will be "inactive" for example, at logic low, which will be defined as to instruct multiplexer 224 to maintain connection of megacell C's output signals 1-8 to pins 2-9 of ASIC 210. Therefore, in normal operation, the existence of the mode control circuit 240 is completely transparent to the end user.

To implement a mode for testing megacell A (test mode), power is applied to ASIC 210, thereby putting the output 242 of megacell C into a predetermined state, such as logic 0. As previously described, the signal at pin 1 will then be at logic 0. By applying a logic high voltage to pin 1, the mode control signal C will be activated, or at logic high. Signal C is connected to multiplexer 224 by conductor 250. This will cause multiplexer 224 to select the signals on lines 222, which are the I/O signals of megacell A labeled 1-8, to be applied to output pins 2-9 of ASIC 210.

At this stage, megacell A can be thoroughly tested since its I/O signals are provided at output pins similar to the case when megacell A existed as die A of device 200 (assuming that input/outputs 15 and 16 of megacell A do not need to be externally connected, because, for example, they are connections to Vdd or Vss).

When the forcing voltage at pin 1 is released, the mode control circuit 240 of FIG. 3 will signal multiplexer 224 by means of mode control signal C. Multiplexer 224 will then connect outputs 1-8 of megacell C to the pins 2-9 of device 210. Additionally, the mode control circuit 240 will output the signal I from megacell C to the pin 1 of device 210 as explained previously. These connections allow device 210 to resume normal mode (non-test mode).

The mode control circuit of 240 of FIG. 3 is the circuit 240 of FIG. 1, and the input and output signals I, C, and PAD are identically labeled. PAD 112 of FIG. 1 is electrically connected to pin 1 of device 210 of FIG. 3. When it is desired to end a test mode, the forcing voltage at PAD 112 will be removed. Referring to FIG. 1, this means that the input 142 to exclusive-OR gate 114 from PAD 112 will be "floating" since neither the forcing voltage at PAD nor a voltage provided by the disabled output drive circuitry 110 will be present.

Exclusive-OR gate 114 is designed so that its floating voltage is the same logic level as the signal I at power up. That is, if the voltage at signal I is designed to be low after power up, the forcing voltage at PAD 112 must be high in order to initiate the test mode. Then exclusive-OR gate 114 of FIG. 1 will then be designed so that its input 142 floats low so that when the high forcing voltage at PAD 112 is removed, the exclusive-OR floating input 142 will be the same potential as the signal I connected to input 140 of the exclusive-OR gate.

Since both inputs to exclusive-OR gate 114 are at the same potential, the output 118 of exclusive-OR gate 114 will be at logic low. This logic low is passed by the glitch filter 120 and applied to NAND gate 122 at input 148. The output of the NAND gate 122 will be high thus causing the OEN signal at input 132 to be high to enable pre-driver 104.

With pre-driver 104 enabled, since signal I is low, PGATE will be high and transistor 106 of output drive circuit 110 will be off. NGATE will be high and transistor 108 of output drive circuit 110 will be turned on to pull PAD 112 low. This low signal at PAD 112 will be applied to input 142 of the exclusive-OR gate 114. Since input 142 was already floating low the circuit will be in a stable state and will thereafter function as described previously, reflecting signal I at PAD 112.

Alternatively, it may not be necessary to enter normal mode immediately after test mode has been ended. For example, after testing, a device is likely to be powered down and removed from the test bed so that another device can be tested. As long as the device is designed so that it enters normal mode upon power up when no forcing voltage is present at PAD 112, the existence of the mode control circuit will be transparent to an end user of the device. In this case the exclusive-OR gate 114 need not be specially designed to have a specific floating logic level as test mode will be ended whenever power to the device is "toggled," i.e. turned off then on.

It is also not necessary to design the signal I to be in a specified state after power up. If, for example, it is known that when given voltage levels are placed onto certain pins of the device 210 that signal I will be at a predetermined logic level, test mode can be entered by placing the voltage levels onto the pins and by applying the forcing voltage to the pin connected to PAD 112.

Another method would require only that the voltage level at PAD 112 be detected. Then a different voltage level, creating an illegal logic state, applied to PAD 112 will initiate test mode. Any means whereby an illegal state between the signal I and the signal at PAD 112 can be forced and detected is within the scope of this invention.

Figure 4:
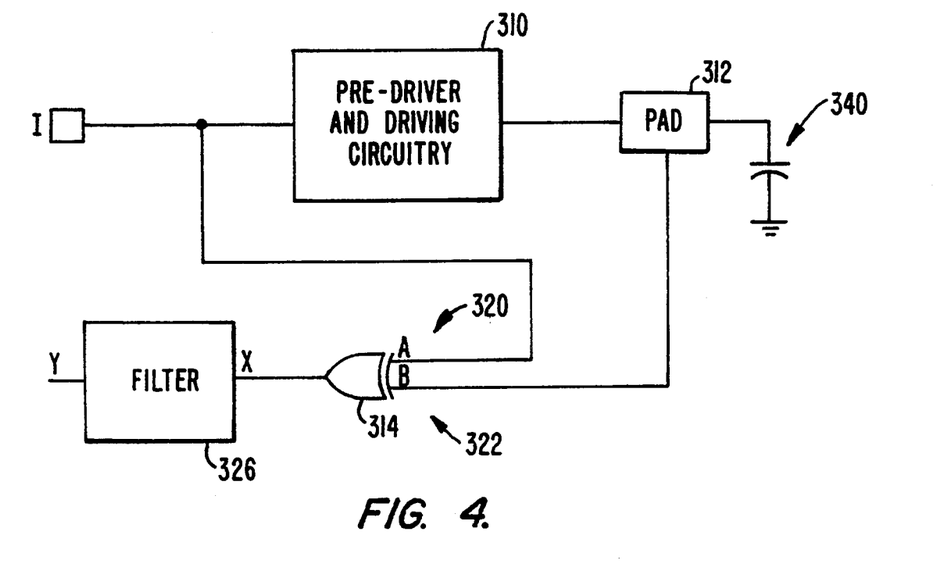
FIG. 4 is a simplified block diagram of the mode control circuit.

FIG. 4 shows a simplified block diagram of the mode control circuit of FIG. 1. The predriver 104 and the output driving circuit 110 of FIG. 1 have been reduced to a single functional block 310 in FIG. 4. In actuality, when a signal is applied at I, the signal experiences a delay in propagating through the components implementing the functional block 310 before reaching pad 312.

More delay may be caused by the effective capacitance of an external circuit which may be electrically connected to PAD 312, as where the ASIC is attached to external circuitry. This capacitance introduces an RC delay in the transitions of the signal at PAD 312. In FIG. 4, this external circuit capacitance is shown by capacitor 340 attached to PAD 312.

The combination of the component delay and the effective capacitance at pad 312 causes the signal B at the input 322 of exclusive-OR gate 114 to be delayed somewhat from the signal A at the input 320. As shown by timing curve 340 of FIG. 5 corresponding to signal A, a transition at signal A is seen before a transition at curve 344 corresponding to signal B. This delay is calculated to be approximately 20 nanoseconds, as shown on the curve 346 labeled X. This delay results in the output of exclusive-OR gate 114 being high for 20 nS in normal operation of the circuit of FIG. 4. The circuit of FIG. 4 is analogous to the circuit of FIG. 1 for purposes of analyzing the propagation delay.

However, glitch filter 326 is designed to prohibit pulses below a certain threshold duration from being passed. Therefore, the curve Y shows that the output of glitch filter 326 is continuously at logic low, notwithstanding the short 20 nanosecond pulses of curve X.

Figure 5:
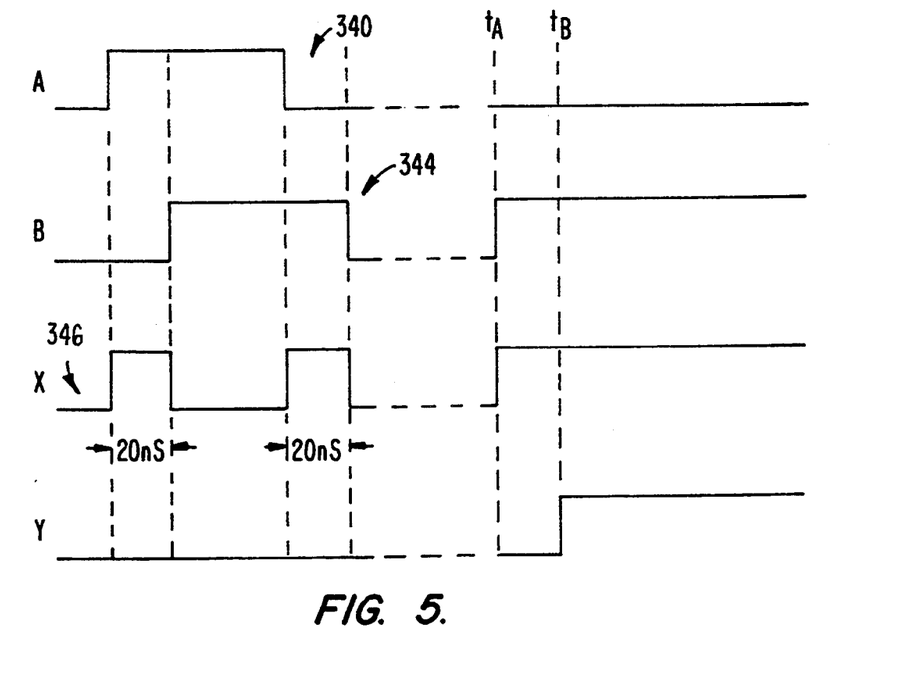
FIG. 5 is a timing diagram of the signals in the circuit of FIG. 4.

At time $t_4$ in the timing diagrams of FIG. 5, the signal B is pulled high, as would be the case where the voltage at PAD 312 is forced to a logic high. The signal A remains low. The signal X will go high because only 1 of signals A and B is now high. It can be seen that at time $t_B$, 20 nanoseconds after signal X goes high, the signal Y at the output of the glitch filter 326 also goes high. This illustrates that the glitch filter will pass signals which are continuously high for a predetermined period of time and will "filter out" spurious false detections caused by the propagation delay.

The construction of such filters is well-known in the art. For example, an inverter chain (not shown) can be used to delay the output X of exclusive-OR gate 314. This delayed signal can be used to gate the output X so that output X must be high for a length of time at least as long as the delay caused by the inverter chain. Other methods for filtering include a monoshot device which disables the output of a signal change for a fixed time, an RC filter or a clocking scheme.

It will be recognized that many variations of the circuit of FIG. 1 (or FIG. 4) are possible. For example, the exclusive-OR gate 114 of FIG. 1 may be replaced by any other circuitry which will serve as a detector of illegal states. The input to such a detector can be one or more of input signals such as the signal I and one or more output signals such as the signal at pad 112, it being critical only that the predetermined combination of signal states making up the illegal state does not occur in normal operation of the circuit.

Also, a latch may be used in place of NAND-gate 122 of FIG. 1, thereby providing that once in test mode the circuit will remain in test mode even after removal of the fixed voltage. This would make it possible for pad 112 to be used as an input signal to convey data by changing logic states rather than being held to a fixed voltage.

The mode control signal C at connection 124 of FIG. 1 also has many possible uses. The useful feature of the circuit of FIG. 1 is that the mode control signal C may be generated easily by application of a fixed voltage to one pin where the use of that pin for the purpose of generating a mode control signal does not interfere with the normal mode of operation for the integrated circuit.

Although the various aspects of the present invention have been described with respect to a preferred embodiment therefore, it will be understood that the invention is entitled to protection within the full scope of the appended claims.

It is claimed:

1. In a packaged electronic device having a plurality of external leads, a mode control circuit for providing a mode control signal, said mode control circuit comprising:
    a driver circuit having a first input connected to an output from other circuitry in said packaged electronic device, a second input for receiving an output enable signal, and an output connected to one of said plurality of external leads, wherein said output of said driver circuit becomes a same logic state as said first input when said output enable signal is in an enabling state, and becomes a high impedance state when said output enable signal is in a disabling state; and
    a logic circuit having a first input connected to said one external lead connected to said output of said driver circuit, a second input connected to said first input of said driver circuit, and an output providing said output enable signal and said mode control signal, wherein said output of said logic circuit causes said output enable signal to be in a disabling state when said first and second inputs of said logic circuit are in different logic states for more than a predetermined period of time.

2. The circuit as recited in claim 1, further comprising means responsive to a voltage applied to said one external lead, for causing said first and second input of said logic circuit to be in different logic states, and said mode control signal to be in a predetermined state.

3. The circuit as recited in claim 2, wherein said logic circuit comprises:
    comparison means for receiving said output from other circuitry and an signal on said one external lead connected on said output of said driver circuit, and generating an output having a first logic state if said first and second inputs are a same logic state, and a second logic state if said first and second inputs are different logic states;
    glitch filter means for passing said output of said comparison means to said output of said logic circuit only if said output of said comparison means remains at a same logic state for said predetermined period of time.

4. The circuit as recited in claim 3, wherein said comparison means comprises an exclusive-OR gate.

5. The circuit as recited in claim 4, wherein said exclusive-OR gate has an input having a floating voltage that is a same logic level as said first input to said driver circuit when power is initially applied to said packaged electronic device, said input of said exclusive-OR gate being connected to said one external lead and responding to said externally applied voltage so that when said externally applied voltage is removed from said one external lead, said input of said exclusive-OR gate returns back to said floating voltage.

6. The circuit as recited in claim 4, wherein said logic circuit further comprises an inverter for receiving said passed output from said glitch filter means, and generates said output enable signal in response thereof.

7. In a packaged electronic device having a plurality of external leads, an integrated circuit comprising:
   at least first and second megacells, each megacell having a plurality of inputs and outputs;
   a multiplexer having a plurality of inputs and outputs, said inputs including a first set of inputs connected to said first megacell, a second set of inputs connected to said second megacell, and a select input, wherein said outputs are connected to a subset of said plurality of external leads, and said multiplexer electrically connects, when said select input is a first logic level, only said first set of inputs to said subset of external leads, and when said select input is a second logic level, only said second set to said subset of external leads; and
   a mode control circuit having a first input connected to one of said plurality of external leads, a second input connected to one of said plurality of inputs and outputs of said at least first and second megacells, and an output providing a mode control signal connected to said select input of said multiplexer.

8. The integrated circuit as recited in claim 7, wherein said mode control circuit comprises:
   a driver circuit having a first input connected to said one of said plurality of inputs and outputs of said at least first and second megacells, a second input for receiving an output enable signal, and an output connected to one of said plurality of external leads, wherein said output of said driver circuit becomes a same logic state as said first input when said output enable signal is in an enabling state, and becomes a high impedance state when said output enable signal is in a disabling state; and
   a logic circuit having a first input connected to said one external lead connected to said output of said driver circuit, a second input connected to said first input of said driver circuit, and an output providing said output enable signal and said mode control signal, wherein said output of said logic circuit causes said output enable signal to be in a disabling state and said mode control signal to be in a first logic state when said first and second inputs of said logic circuit are in different logic states for more than a predetermined period of time.

9. The circuit as recited in claim 8, further comprising means responsive to a voltage applied to said one external lead, for causing said first and second input of said logic circuit to be in different logic states, and said mode control signal to be in a predetermined state.

10. The circuit as recited in claim 9, wherein said logic circuit comprises:
   comparison means for receiving said output from other circuitry and an signal on said one external lead connected on said output of said driver circuit, and generating an output having a first logic state if said first and second inputs are a same logic state, and a second logic state if said first and second inputs are different logic states;
   glitch filter means for passing said output of said comparison means to said output of said logic circuit only if said output of said comparison means remains at a same logic state for a predetermined period of time.

11. The circuit as recited in claim 10, wherein said comparison means comprises an exclusive-OR gate passed output from said glitch filter means, and generates said output enable signal in response thereof.

12. The circuit as recited in claim 11, wherein said exclusive-OR gate has an input having a floating voltage that is a same logic level as said first input to said driver circuit when power is initially applied to said packaged electronic device, said input of said exclusive-OR gate being connected to said one external lead and responding to said externally applied voltage to ensure that when said externally applied voltage is removed from said one external lead, said exclusive-OR gate input returns back to said floating voltage.

13. The circuit as recited in claim 10, said logic circuit further comprising an inverter for receiving said passed output of said glitch filter means, and generating said output enable signal in response thereof.

14. A method of placing a packaged semiconductor device having a plurality of external leads into a test mode, comprising the steps of:
   applying power to said packaged semiconductor device through at least one of said plurality of external leads;
   applying a first voltage signal, generated by said packaged semiconductor device in response to said application of power, to a selected one of said plurality of external leads, said first voltage signal having a first predetermined voltage level corresponding to a first logic state;
   applying a second voltage signal, generated by a circuit external to said packaged semiconductor device, to said selected one of said plurality of external leads, said second voltage signal having a second voltage level corresponding to a second logic state different than said first logic state, thus creating an illegal condition on said selected one of said plurality of external leads; and
   detecting said illegal condition and placing said packaged semiconductor device into said test mode in response thereof.

15. The method as recited in claim 14, wherein said illegal condition detecting step comprises the steps of:
   detecting said first and second voltage signals; and
   comparing said detected first and second voltage signals, and generating a result in response thereof, wherein said result has a voltage level indicating said illegal condition when said first and second voltage signals have voltage levels corresponding to said first and second logic states, respectively.

16. The method as recited in claim 14, further comprising, after said illegal condition detecting step, the step of disconnecting said first voltage signal from said selected one of said plurality of external leads.

17. The method as recited in claim 14, wherein said test mode placing step comprises the steps of:
   generating a mode control signal indicating detection of said illegal condition; and
   disconnecting a plurality of inputs and outputs of a first megacell from a subset of said plurality of external leads and connecting a plurality of inputs and outputs of a second megacell to said subset of external leads in response to said mode control signal indicating detection of said illegal condition.

18. The method as recited in claim 17, further comprising, after said disconnecting and connecting step, the steps of:
   disconnecting said second voltage signal from said selected one external lead;
   detecting said disconnection of said second voltage signal from said selected one external lead;

generating a mode control signal indicating detection of said disconnection of said second voltage signal from said selected one external lead; and disconnecting said plurality of inputs and outputs of said second megacell from said subset of said plurality of external leads and reconnecting said plurality of inputs and outputs of said first megacell back to said subset of external leads in response to said mode control signal indicating detection of said disconnection of said second voltage signal from said selected one external lead.

* * * * *

UNITED STATES PATENT AND TRADEMARK OFFICE
CERTIFICATE OF CORRECTION

PATENT NO. : 5,363,383
DATED : November 8, 1994
INVENTOR(S) : Hanumanthrao Nimishakavi It is certified that error appears in the above-identified patent and that said Letters Patent is hereby corrected as shown below:

In Column 9, line 29 in Claim 8:
    replace "connected to one of said plurality of external leads," with     --connected to said one of said plurality of external leads,--

In Column 9, lines 66-68 in Claim 11:
    replace "comparison means comprises an exclusive-OR gate passed output from said glitch filter means, and generates said output enable signal in response thereof." with     --comparison means comprises an exclusive-OR gate.--

Signed and Sealed this

Twenty-fourth Day of January, 1995

Attest:

BRUCE LEHMAN

*Attesting Officer*     *Commissioner of Patents and Trademarks*